(12) United States Patent
Liu

(10) Patent No.: US 7,655,978 B2
(45) Date of Patent: Feb. 2, 2010

(54) SEMICONDUCTOR STRUCTURE

(75) Inventor: Ya-Sheng Liu, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 297 days.

(21) Appl. No.: 11/946,010

(22) Filed: Nov. 27, 2007

(65) Prior Publication Data

US 2009/0134478 A1 May 28, 2009

(51) Int. Cl.
*H01L 29/94* (2006.01)

(52) U.S. Cl. .................. 257/335; 257/336; 257/408; 257/409; 257/E29.255; 257/E29.258

(58) Field of Classification Search .......... 257/335, 257/336, 408, 409, E29.255, E29.258
See application file for complete search history.

(56) References Cited

U.S. PATENT DOCUMENTS 7,595,558 B2 * 9/2009 Shin .......................... 257/774

* cited by examiner

*Primary Examiner*—Tu-Tu V Ho
(74) *Attorney, Agent, or Firm*—Quintero Law Office

(57) ABSTRACT

A semiconductor structure including a substrate, a first well, a second well, a third well, a first doped region, and a second doped region. The substrate includes a first conductive type. The first well includes a second conductive type and is formed in the substrate. The second well includes the second conductive type and is formed in the first well. The third well includes the first conductive type, is formed in the substrate, and neighbors the first well. The first doped region includes the first conductive type and is formed in the first well. The second doped region includes the first conductive type and is formed in the first well. The first well surrounds all surfaces of the first and the second doped regions.

9 Claims, 2 Drawing Sheets

SEMICONDUCTOR STRUCTURE

BACKGROUND OF THE INVENTION

1. Field of the Invention

The invention relates to a semiconductor structure, and more particularly to a semiconductor structure tolerating higher voltages.

2. Description of the Related Art

Field Effect Transistors (FETs) comprise Metal Oxide Semiconductor FETs (MOSFETs). MOSFETs are widely applied in analog circuits or digital circuits. MOSFETs comprise N type MOSFETs and P type MOSFETs according to channel types. The N type MOSFETs are called NMOSFETs. The P type MOSFETs are called PMOSFETs. Structures of MOSFETs comprise vertical structures and lateral structures. Because lateral structures are easily integrated with the present semiconductor technology, lateral structures are more frequently utilized. The MOSFETs comprising lateral structures are called Lateral Diffused MOSFETs (LD_MOSFETs).

Generally, each LD_MOSFET comprises a drift region. The length of the drift region is increased according to conventional method such that the LD_MOSFET has the capability for tolerating higher voltages. Thus, usable space is reduced and the equivalent impedance of the LD_MOSFET is increased when the LD_MOSFET is turned on.

BRIEF SUMMARY OF THE INVENTION

Semiconductor structures are provided. An exemplary embodiment of a semiconductor structure comprises a substrate, a first well, a second well, a third well, a first doped region, and a second doped region. The substrate comprises a first conductive type. The first well comprises a second conductive type and is formed in the substrate. The second well comprises the second conductive type and is formed in the first well. The third well comprises the first conductive type, is formed in the substrate, and neighbors the first well. The first doped region comprises the first conductive type and is formed in the first well. The second doped region comprises the first conductive type and is formed in the first well. The first well surrounds all surfaces of the first and the second doped regions.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
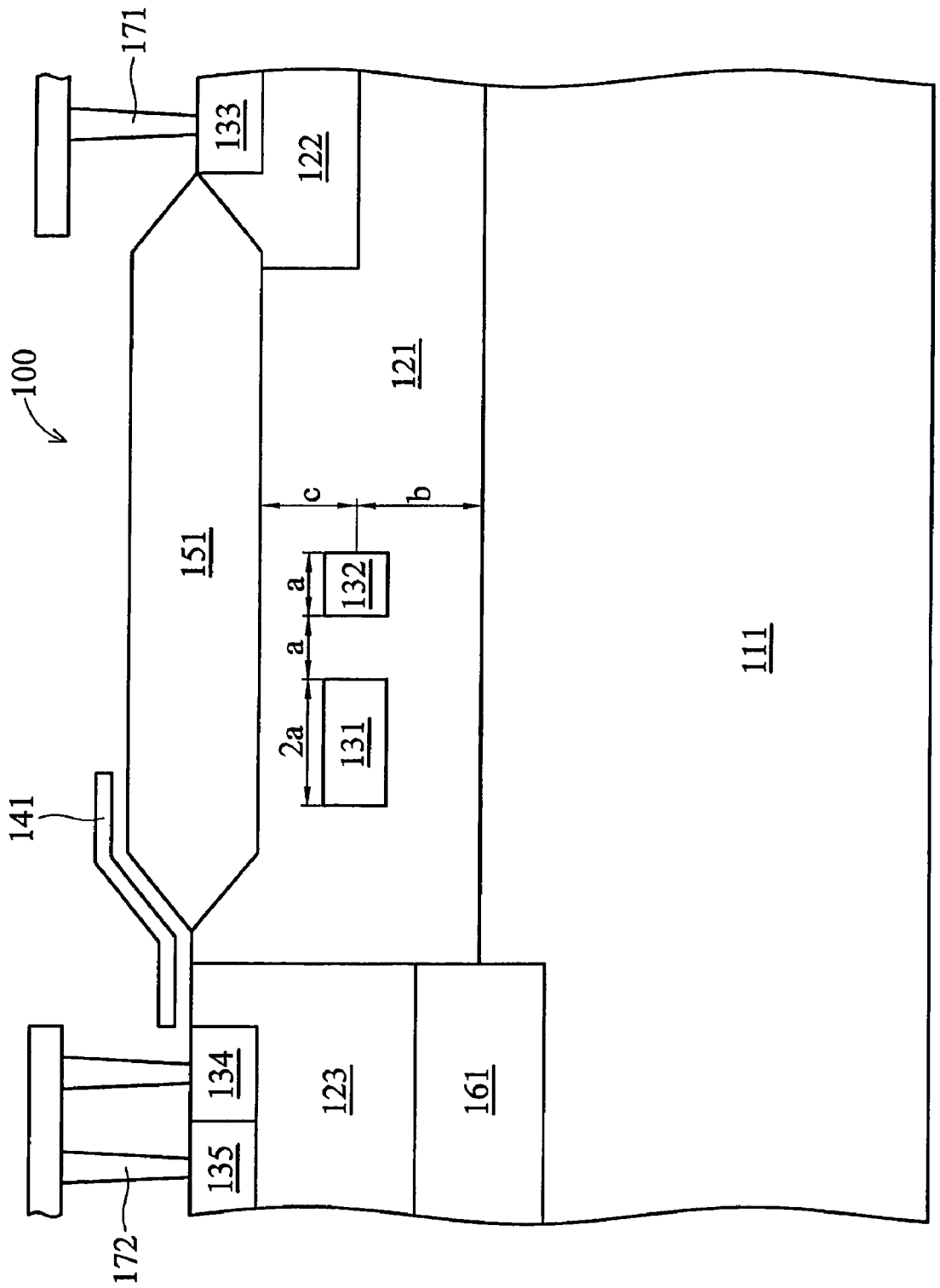
FIG. 1 is a schematic diagram of an exemplary embodiment of a semiconductor structure.

FIG. 1 is a schematic diagram of an exemplary embodiment of a semiconductor structure according to the invention. The semiconductor structure 100 is capable of providing a high voltage LD_MOSFET and comprises a substrate 111, wells 121~123, and doped regions 131 and 132. The well 121 is formed in the substrate 111. The well 122 is formed in the well 121. The doping concentration of the well 122 exceeds that of the well 121. The well 123 is formed in the substrate 111 and neighbors the well 121. The well 121 surrounds all surfaces of the doped regions 131 and 132.

One of the substrate 111, the well 123 and the doped regions 131 and 132 comprises a first conductive type, such as P type or N type. One of the wells 121 and 122 comprise a second conductive type, such as N type or P type. The first conductive type is opposite to the second conductive type. For example when the first conductive type is the P type, the second conductive type is the N type.

In this embodiment, the semiconductor structure 100 further comprises doped regions 133~135, a gate 141, a field oxide 151, and an isolation region 161. The conductive type of the doped region 133 or the doped region 134 is the same as the well 121 and is the second conductive type. The doping concentration of the doped region 133 or the doped region 134 exceeds that of the well 122. The conductive type of the doped region 135 is the same as the well 123. The doping concentration of the doped region 135 exceeds that of the well 123 to serve as an electro-contact point of the well 123. The field oxide 151 is formed between the well 123 and the doped region 133 and overlaps the well 122. The gate 141 is formed on the substrate 111 and overlaps the well 123 and the field oxide 151. The isolation region 161 is a P type buried layer (PBL) or an N type isolation (N-ISO) or an N+ buried layer.

The doped regions 133, 134, and the gate 141 constitute a MOSFET. The doped region 133 serves as a drain of the MOSFET and connects to an external circuit via a contact plug 171. The doped region 134 serves as a source of the MOSFET and connects to the external circuit via a contact plug 172. The well 121 is a drift region such that the MOSFET comprises a lateral structure. Thus, the MOSFET is a LD_MOSFET. Additionally, since the doping concentration of the well 121 is lower, the impedance of the well 121 is higher. Thus, the LD_MOSFET has the capability for tolerating higher voltage such that the LD_MOSFET is a high voltage element.

The operation of the LD_MOSFET is described hereafter in greater detail. Assuming the first conductive type is a P type and the second conductive type is an N type. When the source and the gate are grounded and the drain receives a positive voltage, the PN junction between the P type well 123 and the N type well 121 is depleted. Since the N type well 121 comprises the P type doped regions 131 and 132, the PN junction between the doped regions 131 and 132 and the N type well 121 is depleted. Because the N type well 121 comprises the P type doped regions 131 and 132, the PN junction between the doped regions 131 and 132 and the N type well 121 is increased. Thus, a depletion region is quickly formed.

The doping concentration of the well 121 is reduced according to the conventional method such that the speed forming the depletion region is increased. However, the speed forming the depletion region can be increased because the doped regions 131 and 132 are formed in the well 121. Thus, the doping concentration of the well 121 can be increased when the well 121 is formed in the semiconductor structure 100. Additionally, the breakdown voltage of the LD_MOSFET is increased due to the doped regions 131 and 132.

The number, shape, size, and location of the doped regions, which is formed in the well 121 are not to be limited. Additionally, the distance of the doped regions, which are formed in the well 121 are not to be limited. In this embodiment, the well 121 comprises two doped regions. Referring to FIG. 1, the distance b between the doped regions 131, 132 and the substrate 111 exceeds the distance c between the doped regions 131, 132 and the field oxide. The size of the doped region 131 is larger than or smaller than the size of the doped region 132. In some embodiments, the size of the doped region 131 is two times that of the doped region 132. Additionally, the distance between the doped regions 131 and 132 can equal to the length a of the doped region 132. The length of the doped region 131 can be two times that of the doped region 132.

Figure 2:
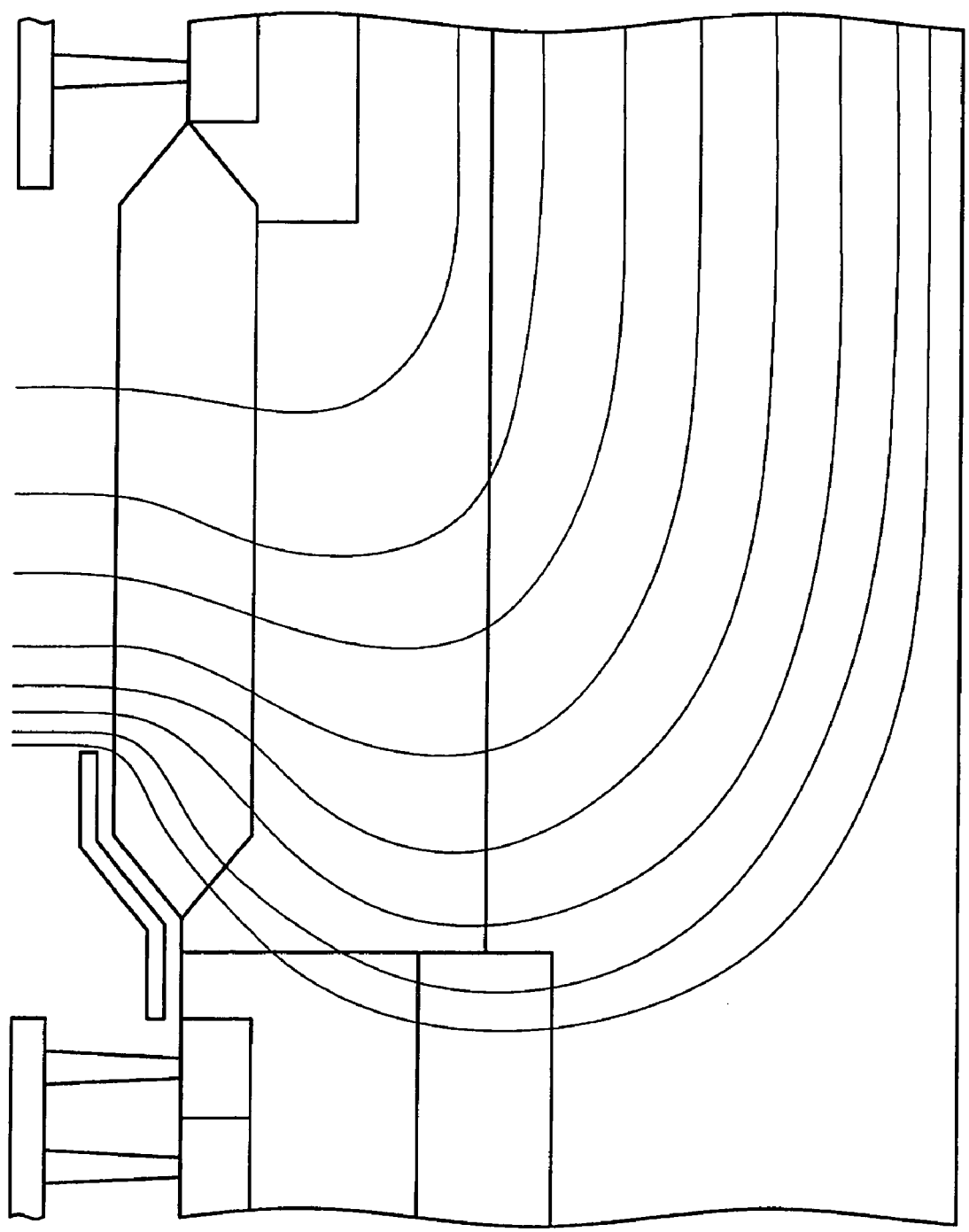
FIG. 2 is a schematic diagram of electric-potential lines of the semiconductor structure shown in FIG. 1.

FIG. 2 is a schematic diagram of electric-potential lines of the semiconductor structure shown in FIG. 1. When the source and the gate are grounded and the drain receives a positive voltage, the doped regions 131 and 132 in the well 121 are depleted. Thus, the semiconductor structure 100 has the best electric-potential distribution. Meanwhile, even if the doped regions in the well 121 are not completely depleted, the electric-potential lines will not to be broken, since there exists a distance between the doped regions 131 and 132, thus allowing the electric-potential lines to still pass through the region between the doped regions 131 and 132.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a substrate comprising a first conductive type;
   a first well comprising a second conductive type and formed in the substrate;
   a second well comprising the second conductive type and formed in the first well;
   a third well comprising the first conductive type, formed in the substrate, and neighboring the first well;
   a first doped region comprising the first conductive type and formed in the first well; and
   a second doped region comprising the first conductive type and formed in the first well, wherein the first well surrounds all surfaces of the first and the second doped regions.

2. The semiconductor structure as claimed in claim 1, further comprising:
   a third doped region comprising the second conductive type and formed in the second well;
   a fourth doped region comprising the second conductive type and formed in the third well; and
   a gate formed on the substrate and overlapping the first and the third wells, wherein the gate, the third doped region, and the fourth doped region constitutes a field effect transistor (FET).

3. The semiconductor structure as claimed in claim 2, further comprising a field oxide formed between the third well and the third doped region and overlapping the second well.

4. The semiconductor structure as claimed in claim 3, wherein a distance between the first and the second doped regions and the substrate exceeds a distance between the first and the second doped regions and the field oxide.

5. The semiconductor structure as claimed in claim 1, wherein the size of the first doped region exceeds the size of the second doped region.

6. The semiconductor structure as claimed in claim 5, wherein the size of the first doped region is two times that of the second doped region.

7. The semiconductor structure as claimed in claim 1, wherein a distance between the first and the second doped regions is equal to the length of the second doped region.

8. The semiconductor structure as claimed in claim 1, wherein the first conductive type is a P type and the second conductive type is an N type.

9. The semiconductor structure as claimed in claim 1, wherein the first conductive type is an N type and the second conductive type is a P type.

* * * * *